(12) United States Patent
Kumagai et al.

(10) Patent No.: US 9,441,291 B2
(45) Date of Patent: Sep. 13, 2016

(54) METHOD OF DEPOSITING A FILM

(71) Applicant: Tokyo Electron Limited, Tokyo (JP)

(72) Inventors: Takeshi Kumagai, Iwate (JP); Muneyuki Otani, Iwate (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 14/700,593

(22) Filed: Apr. 30, 2015

(65) Prior Publication Data

US 2015/0322568 A1 Nov. 12, 2015

(30) Foreign Application Priority Data

May 12, 2014 (JP) .................... 2014-098573

(51) Int. Cl.
| | |
|---|---|
| C23C 16/34 | (2006.01) |
| C23C 16/40 | (2006.01) |
| C23C 16/455 | (2006.01) |
| C23C 16/458 | (2006.01) |
| C23C 16/06 | (2006.01) |

(52) U.S. Cl.
CPC ............ *C23C 16/34* (2013.01); *C23C 16/06* (2013.01); *C23C 16/405* (2013.01); *C23C 16/4584* (2013.01); *C23C 16/45525* (2013.01); *C23C 16/45551* (2013.01); *C23C 16/45574* (2013.01)

(58) Field of Classification Search
CPC ............ C23C 16/34; C23C 16/405; C23C 16/45525; C23C 16/40
See application file for complete search history.

(56) References Cited

U.S. PATENT DOCUMENTS

| | | | | |
|---|---|---|---|---|
| 5,942,319 A * | 8/1999 | Oyama | ............... | G02B 1/116 313/461 |
| 6,737,105 B2 * | 5/2004 | Richard | ............... | C03C 17/42 427/162 |
| 9,011,973 B2 * | 4/2015 | Chu | ............... | C23C 16/06 427/255.31 |
| 2006/0175304 A1 * | 8/2006 | Hwang | ............... | B23K 10/027 219/121.43 |
| 2008/0029801 A1 * | 2/2008 | Nakamura | ............... | H01L 27/10852 257/303 |
| 2009/0130859 A1 | 5/2009 | Itatani et al. | | |
| 2009/0302296 A1 * | 12/2009 | Fuchigami | ............... | H01L 45/08 257/2 |
| 2011/0279979 A1 * | 11/2011 | Mirin | ............... | C23C 16/405 361/708 |
| 2012/0029220 A1 * | 2/2012 | Tada | ............... | B01J 21/063 556/56 |
| 2012/0094143 A1 * | 4/2012 | Zhang | ............... | A61L 27/06 428/615 |
| 2013/0235978 A1 * | 9/2013 | Allen | ............... | H01J 35/101 378/133 |
| 2015/0158762 A1 * | 6/2015 | Ding | ............... | B05D 7/56 428/408 |
| 2016/0056037 A1 * | 2/2016 | Thombare | ............... | H01L 21/02186 438/770 |
| 2016/0060747 A1 * | 3/2016 | Kishiume | ............... | C23C 14/0641 428/698 |

FOREIGN PATENT DOCUMENTS

| | | |
|---|---|---|
| JP | 2005-203502 | 7/2005 |
| WO | 2007/058120 | 5/2007 |

OTHER PUBLICATIONS

Li, Chun-Ting, et al., "Efficient titanium nitride/titanium oxide composite photoanodes for dye-sensitized solar cells and water splitting". J. Mater. Chem. A, 2015, 3, 4695-4705.*

Tinoco, J.C., et al. "Conduction mechanisms of silicon oxide/ titatnium oxide MOS stack structures". Microelectronics Reliability (2007), doi:10.1016/j.microrel.2007.06.005, pp. 1-12.*

Kakati, M., et al., "Synthesis of titanium oxide and titanium nitride nano-particles with narrow size distribution by supersonic thermal plasma expansion". Vacuum 82 (2008) 833-841.*

\* cited by examiner

*Primary Examiner* — Bret Chen
(74) *Attorney, Agent, or Firm* — IPUSA, PLLC

(57) ABSTRACT

A method of depositing a continuous TiN film on a substrate is provided. In the method, a continuous $TiO_2$ film is deposited on a substrate, and then a continuous TiN film is deposited on the continuous $TiO_2$ film. The TiN film is thicker than the $TiO_2$ film.

9 Claims, 7 Drawing Sheets

METHOD OF DEPOSITING A FILM

CROSS-REFERENCE TO RELATED APPLICATION

The present application is based on Japanese Priority Application No. 2014-98573 filed on May 12, 2014, the entire contents of which are hereby incorporated herein by reference.

BACKGROUND OF THE INVENTION

1. Field of the Invention

The present invention relates to a film deposition method.

2. Description of the Related Art

In response to high integration of a semiconductor memory, a capacitor using a high dielectric material such as metallic oxide as a dielectric layer has been widely used. Electrodes of such a capacitor are made of titanium nitride (TiN), for example, with a relatively large work function.

The TiN electrode is formed by depositing a TiN film on a high dielectric film by chemical vapor deposition (CVD) using titanium chloride ($TiCl_4$) and ammonia ($NH_3$) as source gasses, for example, and patterning the TiN film as disclosed in Japanese Patent No. 4583764, for example.

On the other hand, a method of depositing a film using an ALD (Atomic Layer Deposition) method or an MLD (Molecular Layer Deposition) method is known in which the film deposition is performed by depositing an atomic layer or a molecular layer. For example, as disclosed in International Publication No. WO2007/058120, a method of depositing a film for improving step coatability and adhesion of a film is known in which an initial film deposition is performed by using the ALD method and then a main film deposition is performed by using the CVD method. In the initial film deposition step, the ALD method is performed by introducing a Ru source gas into a process chamber so as to adsorb on a substrate while supplying $H_2$ or $NH_3$ into the process chamber as a first reaction gas. Next, in the main film deposition step, the CVD method is performed by introducing a Ti source gas into the process chamber so as to adsorb on the substrate while supplying $O_2$ gas as a second gas.

However, in these days, there is a process that needs a very thin continuous TiN film having, for example, a thickness of 7 nm or thinner, in addition to forming such a TiN electrode. The TiN continuous film is grown by discretely forming TiN island films on a substrate at first, and then by gradually connecting the TiN island films to each other in this order.

Hence, in the event that a too thin TiN film having, for example, a thickness of 4 nm or thinner is assumed to be formed, the TiN island films are unlikely to be connected to each other so as to sufficiently form the continuous film, thereby forming a pinhole therein. Furthermore, in such a growth process as the island films gradually connect to each other, in an actual film deposition process, a film is not deposited on the substrate for a while from the start of film deposition, but only the film islands are formed. The actual film deposition starts after the elapse of a certain amount of time, which causes deposition lag time, thereby reducing a throughput.

SUMMARY OF THE INVENTION

Embodiments of the Present Invention provide a method of depositing a film solving one or more of the problems discussed above.

More specifically, the embodiments of the present invention may provide a method of depositing a film capable of reducing film deposition lag time and reliably depositing a continuous film even in forming a thin TiN film having a thickness of 8 nm or thinner.

According to an embodiment of the present invention, there is provided a method of depositing a continuous TiN film on a substrate. In the method, a continuous $TiO_2$ film is deposited on a substrate, and then a continuous TiN film is deposited on the continuous $TiO_2$ film. The TiN film is thicker than the $TiO_2$ film.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Figure 1:
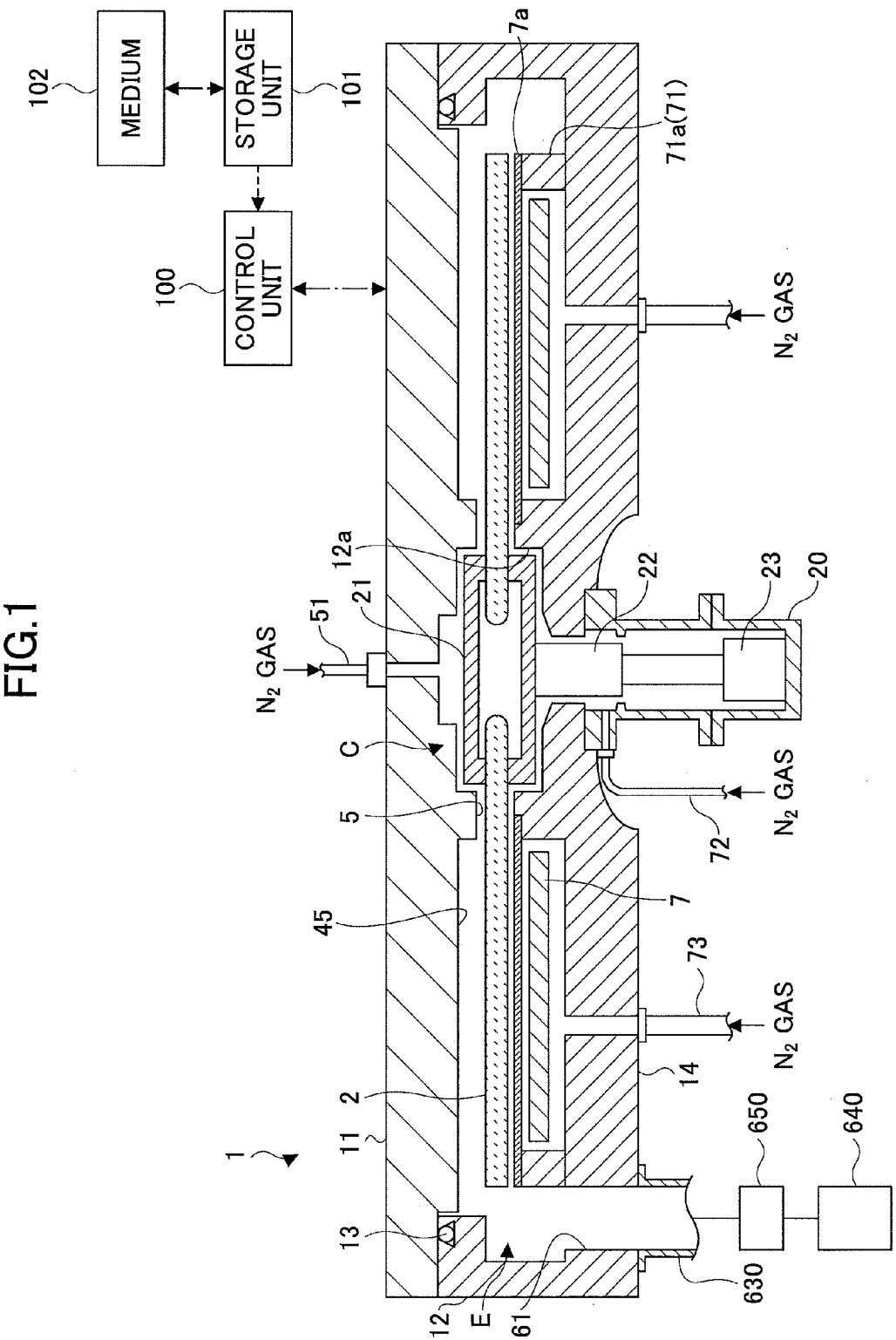
FIG. 1 is a schematic diagram illustrating a preferred film deposition apparatus to implement a method of depositing a film according to an embodiment of the present invention.

A description is given below of a method of depositing a film according to embodiments of the present invention, with reference to accompanying drawings. It is to be noted that, in the explanation of the accompanying drawings, the same components are given the same reference numerals, and overlapping descriptions thereof may be omitted. Further, drawings are not intended to show relative ratio of a component or components. Accordingly, specific dimensions should be determined by a person skilled in the art in light of the following embodiments that are not limited thereto.

[Film Deposition Apparatus]

To begin with, a description is given below of a film deposition apparatus preferred to perform a method of depositing a film according to the embodiments of the present invention.

Figure 2:
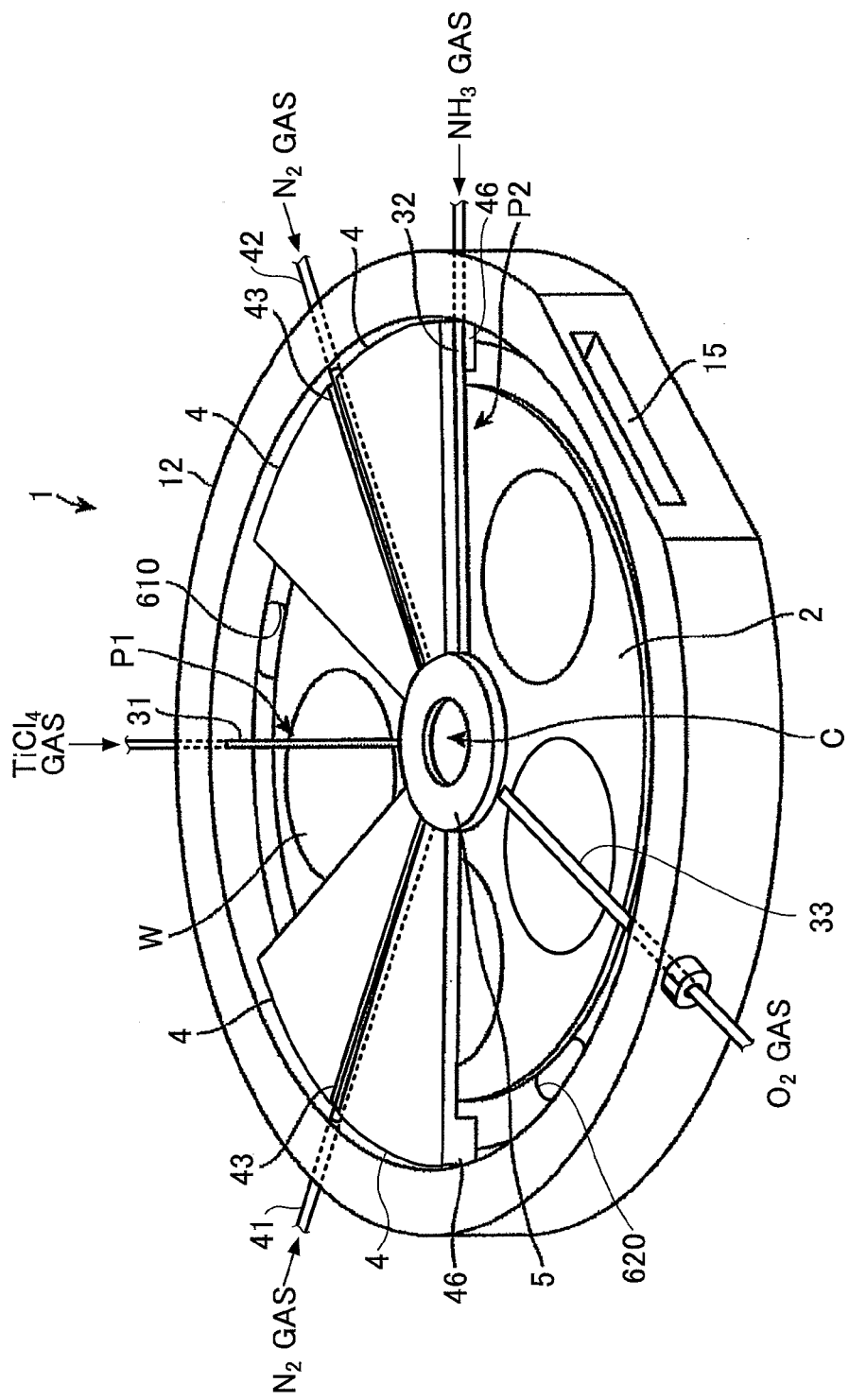
FIG. 2 is a perspective view of the film deposition apparatus illustrated in FIG. 1.
Figure 3:
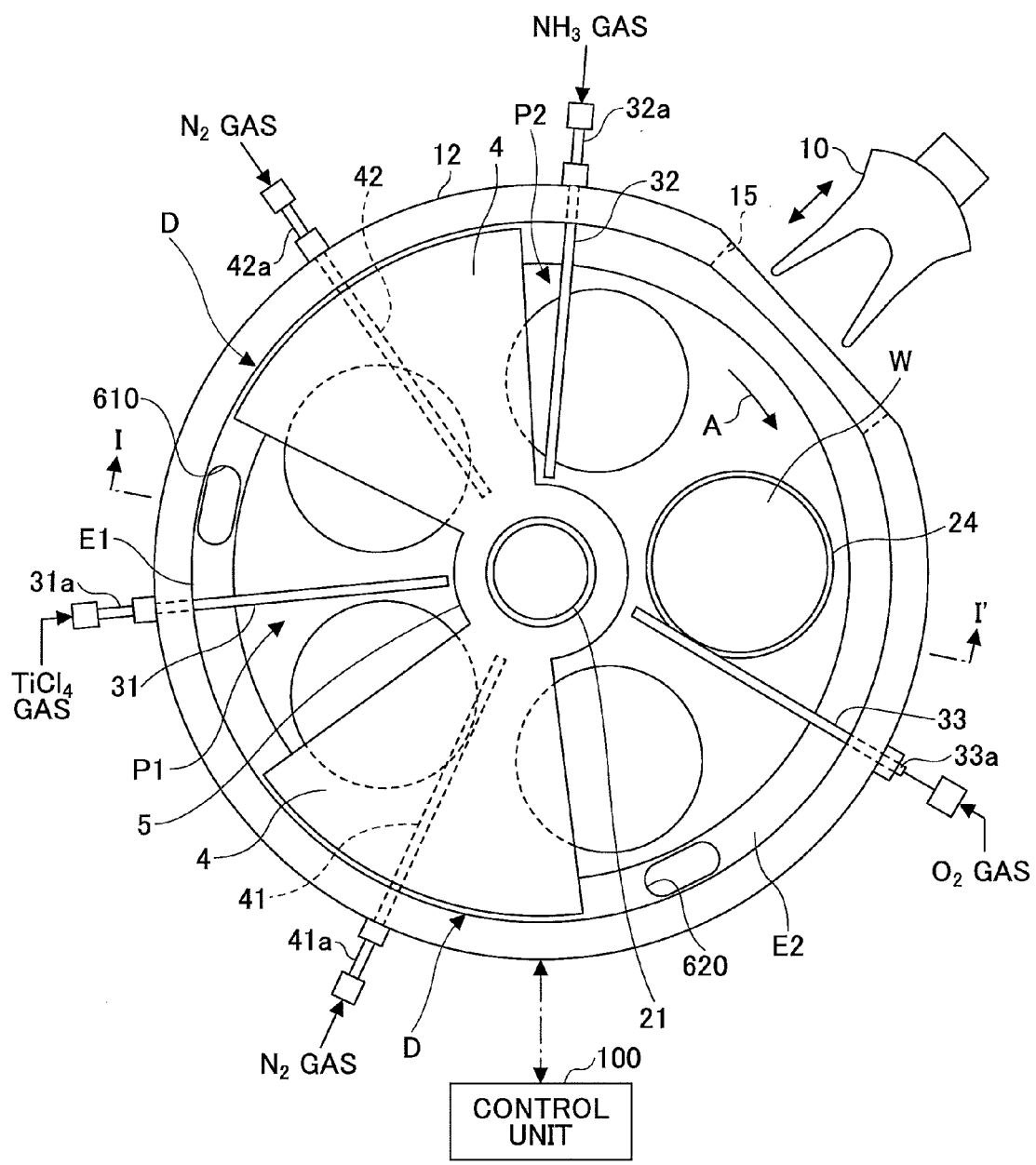
FIG. 3 is a schematic top view illustrating a configuration of the inside of a vacuum chamber of the film deposition apparatus illustrated in FIG. 1.

With reference to FIGS. 1 through 3, the film deposition apparatus includes a vacuum chamber 1 having a substantially flat circular shape in a plan view and a turntable 2 provided in the vacuum chamber 1 and having its rotational center at the center of the vacuum chamber 1. The vacuum chamber 10 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (See FIG. 1) such as an O-ring in an airtight manner.

The turntable 2 is fixed to a cylindrical shaped core portion 21 at its center portion. The core portion 21 is fixed to the upper end of a rotational shaft 22 which is extending in the vertical direction. The rotational shaft 22 is provided to penetrate the bottom portion 14 of the vacuum chamber 10 and the lower end of which is attached to the driving unit 23 that rotates the rotational shaft 22 (See FIG. 1) around a vertical axis. The rotational shaft 22 and the driving unit 23 are housed in a cylindrical case body 20 whose upper surface is open. The case body 20 is attached to a lower surface of the bottom portion 14 of the vacuum chamber 1 via a flange portion provided at its upper surface in an airtight manner so that an inner atmosphere of the case body 20 is isolated from an outside atmosphere.

As illustrated in FIGS. 2 and 3, a plurality of (five in an example of the drawings) circular concave portions 24 are provided in an upper surface of the turntable 2 along a rotational direction (circumferential direction) of the turntable 2 for placing a plurality of semiconductor wafers (which will be simply referred to as "wafers" hereinafter) W, respectively. Here, a wafer is illustrated at only one of the concave portions 24 in FIG. 3 as a matter of convenience. Each of the concave portions 24 has a slightly larger (for example, 4 mm larger) diameter than that of the wafer W, and a depth substantially equal to the thickness of the wafer W. Thus, when the wafer W is loaded in the concave portion 24, the surface of the wafer W and the surface of the turntable 2 (where the wafer W is not placed) becomes almost the same height. Each of the concave portions 24 has through holes (not illustrated in the drawings) formed in its bottom surface to allow, for example, three lift pins (not illustrated in the drawings) to penetrate therethrough to support a back surface of the wafer W and to lift the wafer W.

FIGS. 2 and 3 are drawings for explaining a structure inside the vacuum chamber 1, and a depiction of the ceiling plate 11 is omitted as a matter of convenience. As illustrated in FIGS. 2 and 3, a reaction gas nozzle 31, a reaction gas nozzle 32, a reaction gas nozzle 33 and separation gas nozzles 41 and 42, which are, for example, made of quartz, are arranged at intervals in a circumferential direction of the vacuum chamber 1 (in the rotational direction of the turntable 2 (a direction illustrated by an arrow A in FIG. 3)) above the turntable 2. In the example illustrated in FIG. 3, the separation gas nozzle 41, the reaction gas nozzle 31, the separation gas nozzle 42, the reaction gas nozzle 32 and the reaction gas nozzle 33 are arranged in this order from a transfer opening 15 (which will be explained later) in a clockwise direction (the rotational direction of the turntable 2). Gas introduction ports 31a, 32a, 33a, 41a, and 42a (See FIG. 3) that are base portions of the nozzles 31, 32, 33, 41, and 42, respectively, are fixed to an outer periphery wall of the chamber body 12 so that these nozzles 31, 32, 41, and 42 are introduced into the vacuum chamber 1 from the outer periphery wall of the vacuum chamber 1 so as to extend in parallel with respect to a surface of the turntable 2 along a radial direction.

In the embodiment, the reaction gas nozzle 31 is connected to a titanium chloride ($TiCl_4$) gas supply source (not illustrated in the drawings) via a pipe, a flow rate controller and the like, not illustrated in the drawings. The reaction gas nozzle 32 is connected to a nitriding gas ($NH_3$ and the like) supply source (not illustrated in the drawings) via a pipe, a flow rate controller and the like, not illustrated in the drawings. When the reaction gas nozzle 32 does not supply the nitriding gas, the reaction gas nozzle 32 may be configured to be connectable to an inactive gas supply source by being switched so as to be able to supply the inactive gas such as nitrogen ($N_2$) gas and the like to prevent the reaction gas nozzle 32 from becoming a negative pressure. The reaction gas nozzle 33 is connected to an oxidation gas ($O_2$, $O_3$ and the like) supply source (not illustrated in the drawings) via a pipe, a flow rate controller and the like, not illustrated in the drawings. When the reaction gas nozzle 33 does not supply the oxidation gas, the reaction gas nozzle 33 may be configured to be connectable to the inactive gas supply source such as the nitrogen gas supply source by being switched so as to be able to supply the inactive gas such as nitrogen ($N_2$) gas and the like to prevent the reaction gas nozzle 33 from becoming a negative pressure. The separation gas nozzles 41 and 42 are each connected to separation gas supply sources (not illustrated in the drawings) via pipes and flow rate controllers (not illustrated in the drawings). A noble gas such as helium (He) or argon (Ar), an inactive gas such as nitrogen gas or the like can be used as the separation gas. In this embodiment, $N_2$ gas is used.

Each of the reaction gas nozzles 31, 32 and 33 has a plurality of gas discharge holes 35 (see FIG. 4) which faces downward to the turntable 2 along the longitudinal directions of each of the reaction gas nozzles 31, 32 and 33, for example, at intervals of 10 mm. An area below the reaction gas nozzle 31 is a first process area P1 in which the $TiCl_4$ gas is adsorbed on the wafers W. An area below the reaction gas nozzle 32 is a second process area P2 in which the $TiCl_4$ gas adsorbed on the wafers W at the first process area P1 is nitrided.

Referring to FIGS. 2 and 3, two convex portions 4 are provided in the vacuum chamber 1. As described later, the convex portions 4 are attached to the back surface of the ceiling plate 11 so as to protrude toward the turntable 2 in order to form a separation area D with each of the separation gas nozzles 41 and 42. Each of the convex portions 4 has substantially a sectorial planar shape whose apex is cut into an arc shape. Each of the convex portions 4 is arranged so that the inner arc shaped portion thereof is connected to an inner protruding portion 5 (which will be described later) and the outer arc shaped portion thereof is formed to extend along an inner peripheral surface of the chamber body 12 of the vacuum chamber 1.

Figure 4:
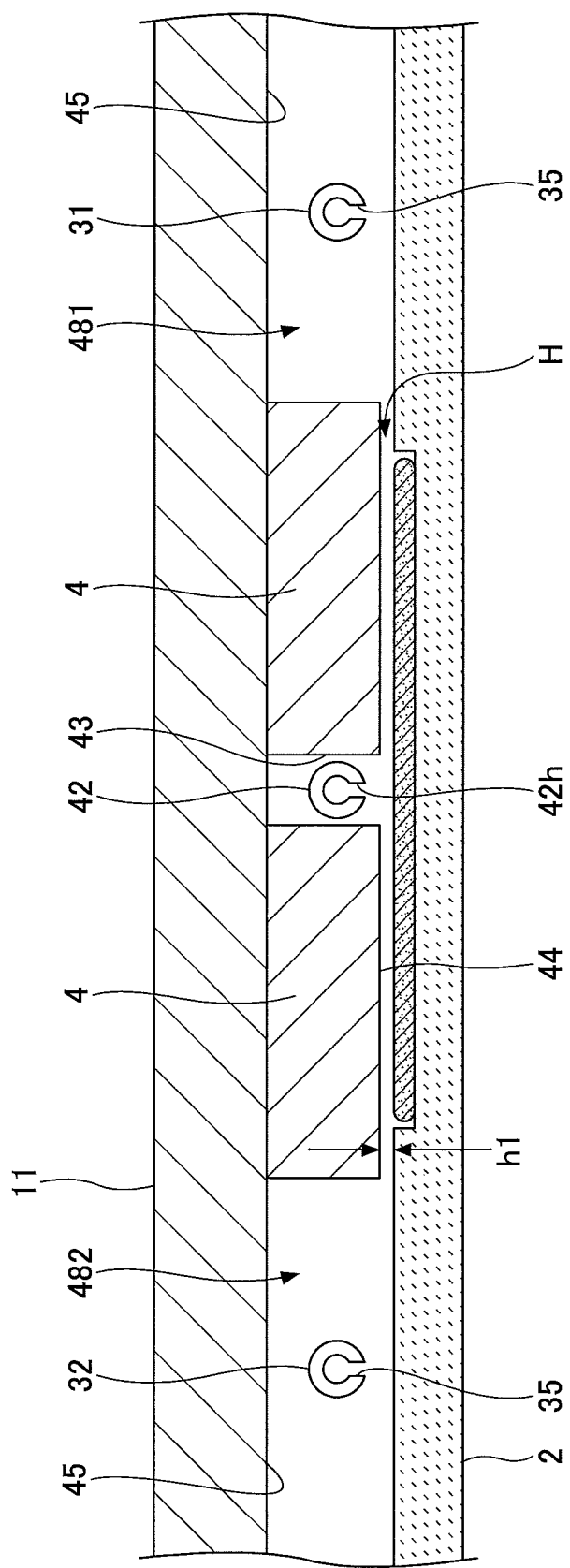
FIG. 4 is a schematic cross-sectional view of the vacuum chamber along a concentric circle of a rotatable turntable provided in the vacuum chamber of the film deposition apparatus illustrated in FIG. 1.

FIG. 4 illustrates a cross-section of the vacuum chamber 1 along a concentric circle of the turntable 2 from the reaction gas nozzle 31 to the reaction gas nozzle 32. As illustrated in FIG. 4, the convex portion 4 is fixed to the back surface of the ceiling plate 11. Thus, there are flat low ceiling surfaces 44 (i.e., first ceiling surface) that are lower surfaces of the convex portions 4 and flat high ceiling surfaces 45 (i.e., second ceiling surface) that are higher than the low ceiling surfaces 44 and located on both sides of the low ceiling surfaces 44 in the circumferential direction. Each of the ceiling surfaces 44 has the sectorial planar shape whose apex is cut into the arc shape. Furthermore, as illustrated in the drawings, the convex portions 4 have a groove portion 43 formed in the center in the circumferential direction so as to extend in the radial direction of the turntable 2. The separation gas nozzle 42 is positioned within the groove portion 43. Although not shown in FIG. 4, the other convex portion 4 also has the groove portion formed therein, and houses the separation gas nozzle 41 therein. Each of the reaction gas nozzles 31 and 32 is provided in a space under each of the high ceiling surfaces 45. Each of the reaction gas nozzles 31 and 32 is provided in the vicinity of the wafer W apart from each of the high ceiling surfaces 45. As illustrated in FIG. 4, the reaction gas nozzle 31 is provided in a right-side space 481 under the high ceiling surface 41, and the reaction gas nozzle 32 is provided in a left-side space 482 under the high ceiling surface 45.

Each of the separation gas nozzles 41 and 42 has a plurality of gas discharge holes 42h (see FIG. 4) formed along the longitudinal direction thereof at a predetermined interval, for example, 10 mm, so as to open toward the turntable 2.

The low ceiling surface 44 provides a separation space H, which is a narrow space, with respect to the turntable 2. When $N_2$ gas is supplied from the discharge holes 42h of the separation gas nozzle 42, $N_2$ gas flows toward the spaces 481 and 482 through the separation space H. At this time, because the volume of the separation space H is smaller than those of the spaces 481 and 482, the pressure in the separation space H can be made higher than those in the spaces 481 and 482 by $N_2$ gas. This means that the separation space H having a high pressure is formed between the spaces 481 and 482. Moreover, $N_2$ gas flowing from the separation space H toward the spaces 481 and 482 functions as a counter flow against $TiCl_4$ gas from the gas first process area P1 and $NH_3$ gas from the second process area P2. Accordingly, $TiCl_4$ gas from the first process area P1 and $NH_3$ gas from the second process area P2 are separated by the separation space H. Therefore, mixing and reaction of $TiCl_4$ gas with $NH_3$ gas are prevented in the vacuum chamber 1.

The height h1 of the low ceiling surface 44 from the upper surface of the turntable 2 is preferred to be appropriately determined based on the pressure of the vacuum chamber 1 during the film deposition, the rotational speed of the turntable 2, and a supplying amount (flow rate) of the separation gas ($N_2$ gas) in order to maintain the pressure in the separation space H higher than those in the spaces 481 and 482.

Referring to FIGS. 1 through 3, the ceiling plate 11 has the protruding portion 5 at its lower surface to surround the outer periphery of the core portion 21 which fixes the turntable 2. The protruding portion 5 is continuously formed with the inner portion of the convex portions 4, and a lower surface thereof is formed at the same height as those of the low ceiling surfaces 44, in this embodiment.

Figure 5:
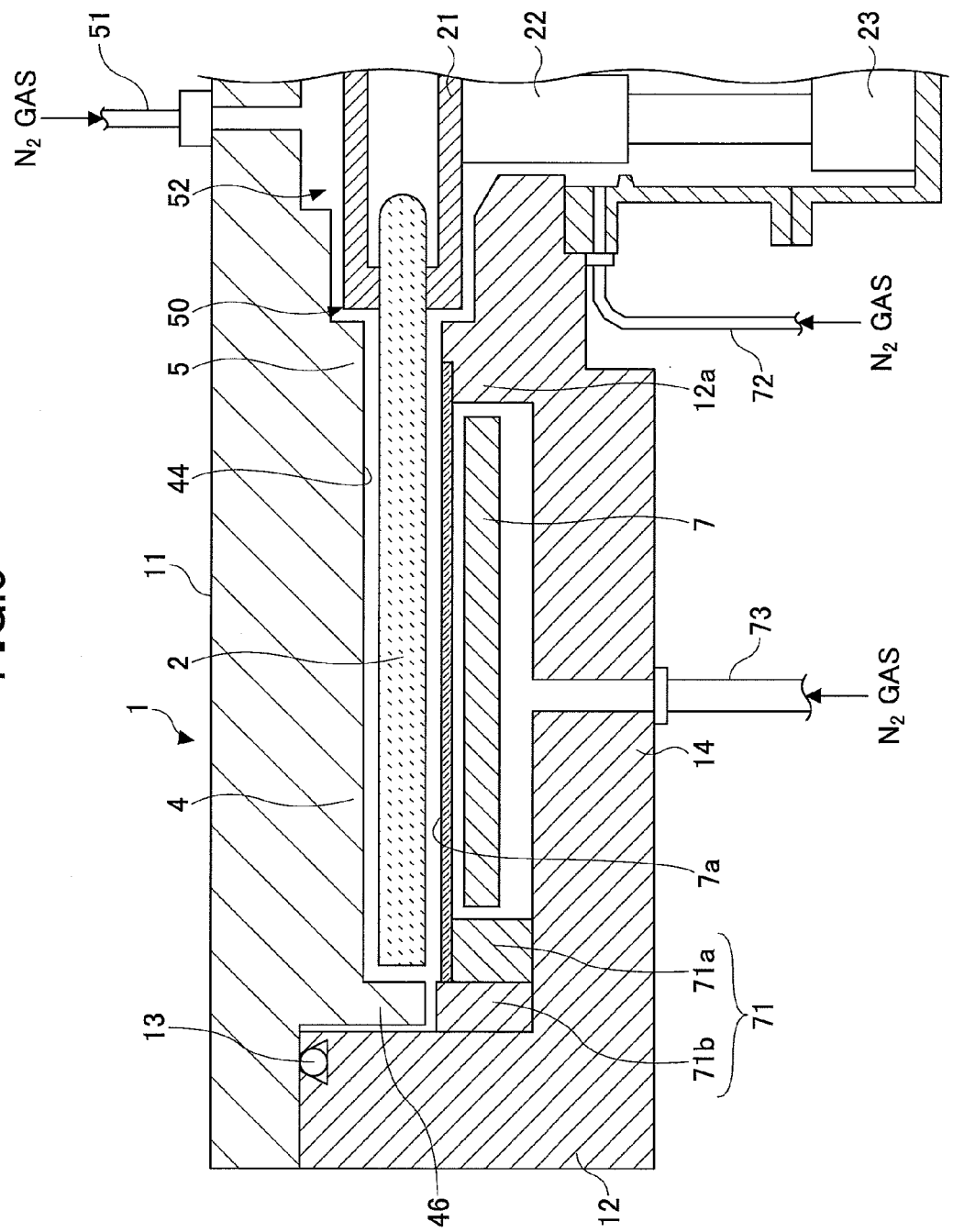
FIG. 5 is another schematic cross-sectional view of the film deposition apparatus illustrated in FIG. 1.

FIG. 1 is a cross-sectional view taken along an I-I' line in FIG. 3, and illustrates an area where the ceiling surface 45 is provided. FIG. 5 is a partial cross-sectional view illustrating an area where the ceiling surface 44 is provided. As illustrated in FIG. 5, the sectorial convex portion 4 includes a bending portion 46 formed in its outer periphery (at an outer peripheral portion side of the vacuum chamber 1) that is bent to have an L-shape so as to face an outer end surface of the turntable 2. The bending portion 46 suppresses the reaction gasses from flowing into the separation area D from both sides of the separation area D and mixing with each other as well as the concave portion 4. Because the sectorial convex portions 4 are attached to the ceiling plate 11 and the ceiling plate 11 is detachably attached to the chamber body 12, there is a slight space between the outer peripheral surface of the bending portion 46 and the chamber body 12. The space between the inner peripheral surface of the bending portion 46 and an outer end surface of the turntable 2, and the space between the outer periphery surface of the bending portion 46 and the chamber body 12 is set at the same dimension as the height h1 (See FIG. 4) of the low ceiling surface 44 with respect to the upper surface of the turntable 2, for example.

As illustrated in FIG. 5, the inner peripheral wall of the chamber body 12 is formed to extend in a vertical direction to be closer to the outer peripheral surface of the bending portion 46 at the separation area D. However, other than the separation area D, as illustrated in FIG. 1, for example, the inner peripheral wall of the chamber body 12 is formed to be recessed outward from a portion facing the outer end surface of the turntable 2 to the bottom portion 14. Hereinafter, for an explanatory purpose, the recessed portion, having a substantially rectangular cross-sectional view, is referred to as an evacuation area. More specifically, a part of the evacuation area which is in communication with the first process area P1 is referred to as a first evacuation area E1, and a part of the evacuation area which is in communication with the second process area P2 is referred to as a second evacuation area E2. As illustrated in FIGS. 1 through 3, a first evacuation port 610 and a second evacuation port 620 are respectively formed in the bottom portions of the first evacuation area E1 and the second evacuation area E2. The first evacuation port 610 and the second evacuation port 620 are connected to vacuum pumps 640, which are vacuum evacuation units, via exhaust pipes 630, respectively, as shown in FIG. 1. In addition, a pressure controller 650 is provided between the vacuum pump 640 and the exhaust pipe 630.

A heater unit 7 is provided at a space between the turntable 2 and the bottom portion 14 of the vacuum chamber 10 as illustrated in FIGS. 1 and 5. The wafers W placed on the turntable 2 are heated by the heater unit 7 through the turntable 2 to a temperature (e.g., 400° C.) determined by a process recipe. A ring shaped cover member 71 is provided below the outer periphery of the turntable 2 in order to separate an atmosphere above the turntable 2 to the evacuation areas E1 and E2 from an atmosphere in which the heater unit 7 is provided so as to prevent the gasses from flowing into the space under the turntable 2 (See FIG. 5). The cover member 71 includes an inner member 71a that is provided to face the outer edge portion and the further outer portion of the turntable 2 from below, and an outer member 71b that is provided between the inner member 71a and an inner wall surface of the vacuum chamber 1. The outer member 71b is provided under the bending portion 46 that is formed in the outer edge portion of each of the convex portions 4. The inner member 71a is provided to surround the entire circumference of the heater unit 7 below the outer end portion (and at a slightly outside of the outer end portion) of the turntable 2.

A part of the bottom portion 14 closer to the rotational center than the space including the heater unit 7 forms a projecting portion 12a by protruding upward so as to approach the core portion 21 located near the central portion of the lower surface of the turntable 2. A space between the projecting portion 12a and the core portion 21 is narrow. Furthermore, a space between an inner peripheral surface of the bottom portion 14 and the rotational shaft 22 is narrow, and these narrow spaces are in communication with the case body 20. A purge gas supplying pipe 72 that supplies $N_2$ gas as the purge gas to the narrow spaces is provided in the case body 20 for purging. A plurality of purge gas supplying pipes (only one of the purge gas supplying pipes 73 is illustrated in FIG. 5) are provided in the bottom portion 14 of the vacuum chamber 10 under the heater unit 7 at a predetermined angular interval in the circumferential direction to purge the space including the heater unit 7. Moreover, a cover member 7a is provided between the heater unit 7 and the turntable 2 to prevent the gas from flowing into the space including the heater unit 7. The cover member 7a is provided to cover an area between an inner peripheral wall (upper surface of the inner member 71a) of the outer member 71b and an upper end portion of the projecting portion 12a throughout the circumferential direction. For example, the cover member 7a can be made of quartz.

A separation gas supplying pipe 51 is connected to a central portion of the ceiling plate 11 of the vacuum chamber 1 so as to supply $N_2$ gas as the separation gas to a space 52 between the ceiling plate 11 and the core portion 21. The separation gas supplied to the space 52 is discharged toward the periphery through a narrow space between the inner protruding portion 5 and the turntable 2 by flowing along the upper surface including the wafer receiving area of the turntable 2. The space 50 is kept at a pressure higher than those of the spaces 481 and 482 by the separation gas. Thus, the space 50 serves to prevent $TiCl_4$ gas supplied to the first process area P1 and $NH_3$ gas supplied to the second process area P2 from mixing with each other by flowing through the central area C. It means that the space 50 (or the central area C) can function similarly to the separation space H (or the separation area D).

As illustrated in FIGS. 2 and 3, a transfer opening 15 is formed in a side wall of the vacuum chamber 1 to transfer the wafers W, which are substrates, between a transfer arm 10 provided outside the vacuum chamber 1 and the turntable 2 inside the vacuum chamber 1. The transfer opening 15 is opened and closed by a gate valve (not illustrated in the drawings). Furthermore, because the wafer W of the substrate is transferred at a position facing the transfer opening 15 between the transfer arm 10 and the concave portion 24 that is a wafer receiving area, lift pins, which penetrate through the concave portion 24 to lift up the wafer W from the backside surface thereof, and a lifting mechanism to move the lift pins up and down (neither is illustrated in the drawings) are provided under the turntable 2 at a location corresponding to the wafer transferring position.

As illustrated in FIG. 1, the film deposition apparatus according to the embodiment includes a control unit 100 that controls the entirety operation of the film deposition apparatus. The control unit 100 is constituted of a computer. The control unit includes a memory unit, which stores a program to cause the film deposition apparatus to implement a method of depositing a film described later under the control by the control unit 100. The program is designed to include a step group capable of executing the method of depositing the film, stored in a medium 102 such as a hard disk, a compact disc, a magneto-optical disk, a memory card, a flexible disk or the like, read by a predetermined reader to store in a storage unit 102, and installed in the control unit 100.

[Method of Depositing a Film]

Figure 6:
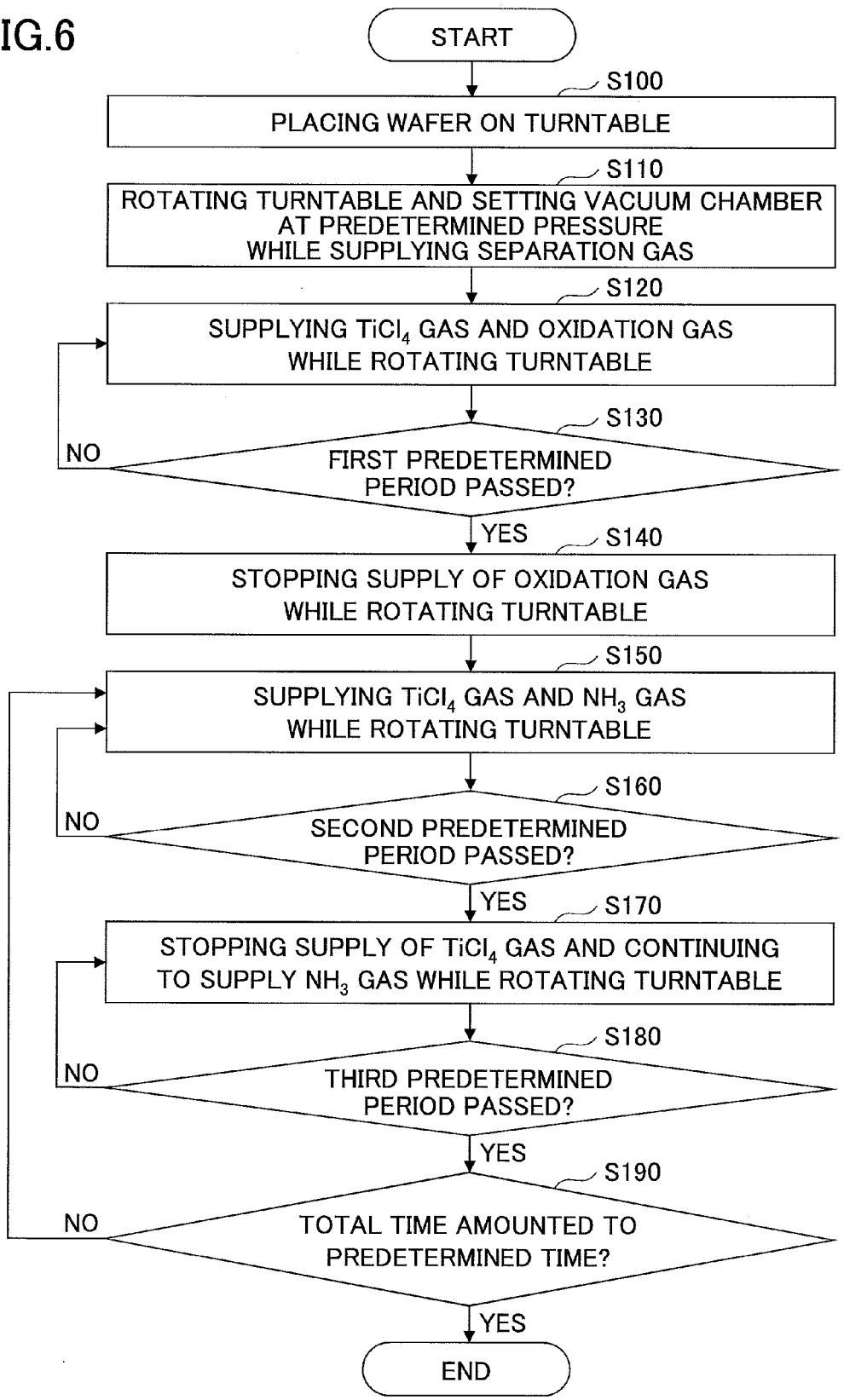
FIG. 6 is a flowchart illustrating a method of depositing a film according to an embodiment of the present invention.

Next, a description is given below of a method of depositing a film according to embodiments of the present invention, with reference to FIG. 6. In the following description, a description is given by citing an example of using the above-mentioned film deposition apparatus.

To begin with, in step S100 (See FIG. 6), a wafer W is placed on the turntable 2. More specifically, the gate valve (not illustrated in the drawings) is opened, and the wafer W is transferred from the outside of the vacuum chamber 1 into the concave portion 24 of the turntable 2 through the transfer opening 15 (See FIGS. 2 and 3) by the transfer arm 10 (See FIG. 3). This transfer is performed by causing the lifting pins (not illustrated in the drawings) to move up and down from the bottom side of the vacuum chamber 1 through the through-holes provided in the bottom surface of the concave portion 24 when the concave portion 24 stops in front of the transfer opening 15. Such a transfer of the wafer W is repeated by intermittently rotating the turntable 2, and the wafers W are placed in five of the concave portions 24 of the turntable 2, respectively.

Subsequently, the gate valve is closed, and the vacuum chamber 1 is evacuated to a reachable degree of vacuum by the vacuum pump 640. After that, in step S110, $N_2$ gas is supplied to the wafers W from the separation gas nozzles 41 and 42 at a predetermined flow rate, and $N_2$ gas is also supplied to the wafers W from the separation gas supplying pipe 51 and the purge gas supplying pipes 72 at a predetermined flow rate. Following this, the vacuum chamber 1 is controlled to be a preliminarily set process pressure by the pressure control unit 650 (See FIG. 1). Next, the wafers W are heated up to, for example, 400° C. by the heater unit 7 while rotating the turntable 2 in a clockwise fashion at a rotational speed of, for example, 20 rpm.

After that, in step S120, $TiCl_4$ gas is supplied to the wafers W from the reaction gas nozzle 31 (See FIGS. 2 and 3), and an oxidation gas such as $O_2$ gas, $O_3$ gas or the like is supplied to the wafers W from the reaction gas nozzle 33. The reaction gas nozzle 32 may supply an oxidation gas such as $O_2$ gas, $O_3$ gas or the like, or may not supply any gas. For example, as described above, the reaction gas nozzle 32 may supply a certain amount of $N_2$ gas that makes the inside of the reaction gas nozzle a positive pressure. By rotating the turntable 2, the wafers W pass the first process area P1, the separation area D (i.e., the separation space H), the second process area P2 and the separation area D (i.e., the separation space H) in this order (See FIG. 3). First, $TiCl_4$ gas from the reaction gas nozzle 31 adsorbs on the wafers W in the first process area P1. Next, when the wafers W reach the second process area P2 after passing through the separation area D (separation space H) having an atmosphere filled with $N_2$ gas, $TiCl_4$ gas adsorbed on the wafers W reacts with the oxidation gas from the reaction gas nozzle 33, and a $TiO_2$ film is deposited on the wafers W. Then, the wafers W reach the separation area D (separation space H having an atmosphere filled with $N_2$ gas). By rotating the turntable 2 a plurality of number of times, this cycle is repeated the plurality of number of times.

During this process, it is determined whether or not the supply of $TiCl_4$ gas from the reaction gas nozzle 31 and the oxidation gas from the reaction gas nozzle 33 is performed for a first predetermined period of time (step S130). The first predetermined period of time is set at a period of time during which the $TiO_2$ film can be deposited as a continuous film, not an island film. For example, because the $TiO_2$ film can be sufficiently deposited as a continuous film even having a thickness of 2 nm or thinner, the first predetermined period of time may be set at an appropriate period of time during which the $TiO_2$ film can be deposited as the continuous film having a thickness 2 nm or thinner. The $TiO_2$ film is an underlying film of a TiN film, and is not a film aimed at production in general. Hence, the $TiO_2$ film is preferred to be deposited as thin as possible within a range capable of reliably depositing the continuous film. Accordingly, the film thickness of the $TiO_2$ film may be set at a proper value, for example, in a range from 0.1 to 2 nm. By determining the targeted film thickness, the process time for depositing the continuous film of $TiO_2$ can be properly determined in consideration of the conditions such as the rotational speed of the turntable 2, the flow rates of TiCl$_4$ gas and the oxidation gas, the substrate temperature and the like. For example, the first predetermined period of time for depositing the continuous TiO$_2$ film can be set in this manner.

The TiO$_2$ film has a function of removing contamination, and is considered to have a function of removing the contamination on the wafers W. This serves to create a surface state easy to deposit the TiN film as a continuous film on the surfaces of the wafers W from the beginning.

Here, another underlying film may be formed on the surfaces of the wafers W other than the TiO$_2$ film from the beginning. For example, when each of the wafers W is a silicon substrate, a SiO$_2$ film, which is a natural oxidation film, is generally formed on the surface of each of the wafers W. In such a case, the TiO$_2$ film can be deposited on the underlying film formed on the wafers W from the beginning. Even when the underlying film formed on the wafers W is not preferable for the deposition of the TiN film, by depositing the continuous film of TiO$_2$ on the underlying film, the surface state of the wafers W can be made a preferable state easy to deposit the continuous film of TiN.

In step S130, when it is determined that the first predetermined period of time does not elapse, the process returns to step S120. In step S120, the film deposition process of the TiO$_2$ film is continued. On the other hand, when the first predetermined period of time has passed, the process advances to step S140.

In step S140, the supply of the oxidation gas from the reaction gas nozzles 32 and 33 stops, and N$_2$ gas is continuously supplied from the separation gas nozzles 41 and 42 while rotating the turntable 2. In addition, if necessary, the supply of TiCl$_4$ gas from the reaction gas nozzle 31 stops. Because TiCl$_4$ gas is also supplied in the next film deposition process for depositing the TiN film, TiCl$_4$ gas may be continuously supplied, or the supply of TiCl$_4$ gas may be stopped once at a stage of having deposited the TiO$_2$ continuous film.

After that, in step S150, TiCl$_4$ gas is supplied from the reaction gas nozzle 31, and NH$_3$ gas is supplied from the reaction gas nozzle 32 (See FIGS. 2 and 3). The reaction gas nozzle 33 may supply NH$_3$ gas as well as the reaction gas nozzle 32, or may not supply any gas. Or, the reaction gas nozzle 33 may supply a certain amount of N$_2$ gas capable of making the inside of the reaction gas nozzle 33 a positive pressure. By rotating the turntable 2, the wafers W pass through the first process area P1, the separation area D (separation space H), the second process area P2 and the separation area D (separation space H) in this order (See FIG. 3). First, TiCl$_4$ gas adsorbs on the wafers W in the first process area P1. Next, when the wafers W reach the second process area P2 after passing through the separation area D (separation space H) having an atmosphere filled with N$_2$ gas, TiC$_4$ gas adsorbed on the wafers W reacts with NH$_3$ gas from the reaction gas nozzle 32, and a TiN film is deposited on the wafers W. Moreover, NH$_4$Cl is generated as a by-product, which is released into a gas phase and evacuated with the separation gas and the like. Then, the wafers W reach the separation area D (separation space H having the atmosphere filled with N$_2$ gas).

During the process, it is determined whether or not the supply of TiCl$_4$ gas from the reaction gas nozzle 31 and NH$_3$ gas from the reaction gas nozzle 32 is performed for a second predetermined period of time (step S160). The second predetermined period of time may be determined based on a targeted film thickness of the TiN film. The method of depositing the film according to the embodiments of the present invention can be applied to a film deposition of the TiN film having a variety of film thicknesses. Although there is no upper limitation of the film thickness, the method of depositing the film according to the embodiments of the present invention can efficiently exert its effect in particular when the TiN film having a film thickness of 8 nm or thinner is deposited. In other words, in the conventional method of depositing the film, the TiN film is deposited discretely like islands at first, and then the island films are connected as time proceeds so as to form a continuous film in sequence. Hence, when a very thin TiN film having a thickness of 8 nm or thinner is deposited, the island films are not connected to each other continuously enough, and a pinhole is likely to be generated. Moreover, during an initial stage of forming the island films, the actual deposition of the TiN film does not start immediately even after the deposition process starts, which causes deposition delay time (which may be hereinafter called "incubation time").

However, by depositing the TiO$_2$ film as the underlying film and then depositing the TiN film, the island film of TiN film does not occur and the actual deposition of the continuous TiN film starts from the beginning of the film deposition process. Thus, the TiN film may be set to have any film thickness as long as the film thickness is set thicker than that of the TiO$_2$ film of the underlying film. In other words, there is no upper limitation of the film thickness of TiN film. The film thickness may be set at 10 nm or thicker, or at 1 nm or thicker and 8 nm or thinner, for example, at a very thin film thickness in a range from 1 to 4 nm.

When the second period of time does not elapse (step S160: NO), the film deposition of TiN film continues (step S150). On the other hand, when the second period of time has elapsed (step S160: YES), the process advances to the next step S170.

In step S170, the rotation of the turntable 2 and the supply of NH$_3$ gas from the reaction gas nozzle 32 continue, and the supply of TiCl$_4$ gas from the reaction gas nozzle 31 stops. This causes the wafers W to be exposed to N$_2$ gas (separation gas) and NH$_3$ gas alternately. The deposited TiN film may contain remaining chlorine (Cl) produced by unreacted TiCl$_4$ or decomposition of TiCl$_4$. Unreacted TiCl$_4$ reacts with NH$_3$ and produces TiN, and remaining Cl releases from the TiN film by reacting with NH$_3$ and becoming NH$_4$Cl. This makes it possible to reduce impurities within the deposited TiN film, to enhance the film quality of the TiN film, and to reduce the resistivity thereof.

After starting step S170, it is determined whether the supply of NH$_3$ gas from the second reaction gas 32 has been performed for a predetermined third period of time (step S180). The third predetermined period of time can be set at an appropriate period of time in consideration of the film quality enhancement of TiN film and the throughput.

When the third predetermined period of time does not elapse (step S180: NO), step S170 continues. When the third predetermined period of time has elapsed (step S180: YES), the process goes to step S190.

In step S190, it is determined whether total time of steps S150 and S170 reaches a predetermined time. When the total time does not reach the predetermined time (step S190: NO), the process returns to step S150, and TiN is further deposited. When the total time reaches the predetermined time (step S190: YES), the supply of TiCl$_4$ gas and NH$_3$ gas stops, and the film deposition ends.

Working Example

A description is given below of a working example performed to confirm an effect of the above-described method of depositing the film. In the following description, as a matter of convenience, step (S120) of supplying TiCl$_4$ gas and an oxidation gas while rotating the turntable 2 is called a "TiO$_2$ film deposition step", and step (S170) of supplying TiCl$_4$ gas and NH$_3$ gas while rotating the turntable 2 is called a "TiN film deposition step". Here, a temperature of the wafers W during the TiO$_2$ film deposition step and the TiN film deposition step is the same as each other.

Figure 7:
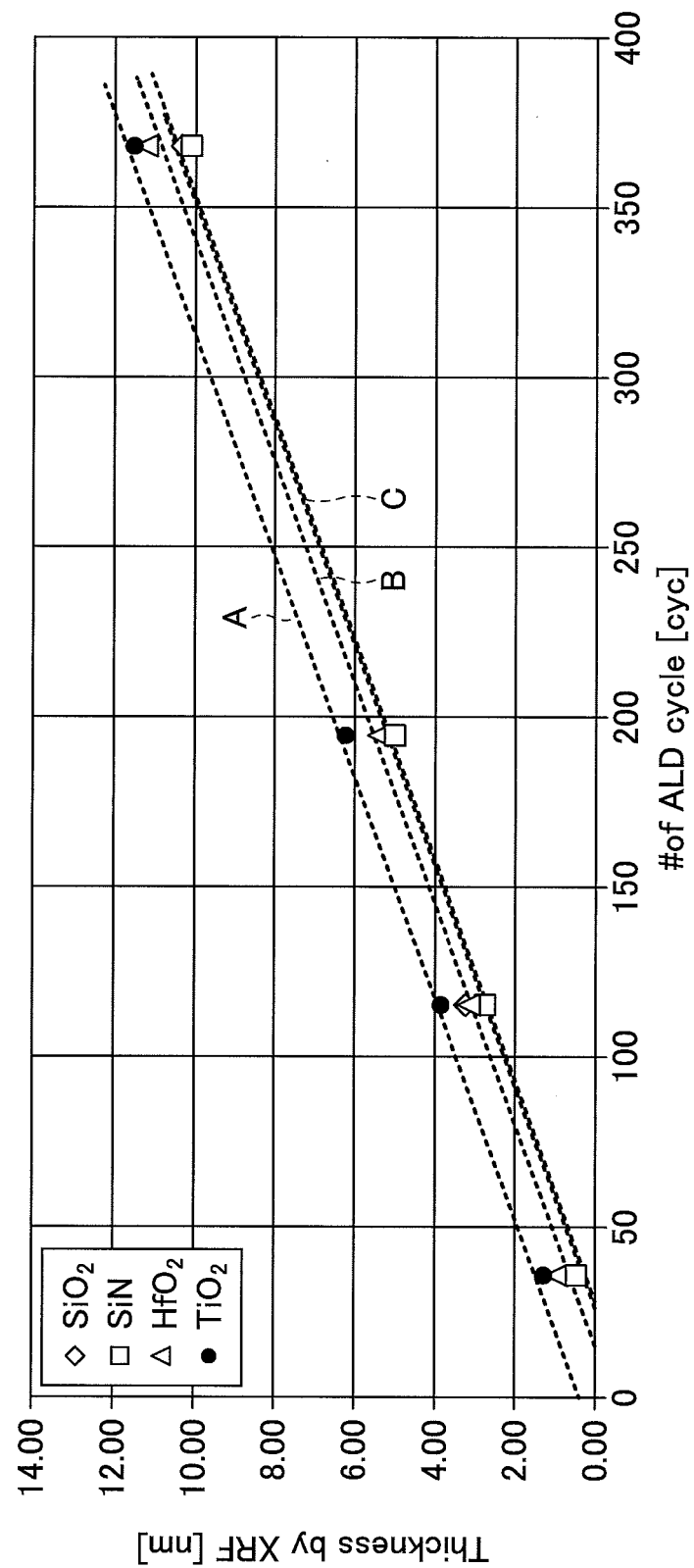
FIG. 7 is a graph illustrating a result of the method of depositing a film of a working example of the present invention.

FIG. 7 is a graph showing a result of the method of depositing the film according to the embodiments of the present invention with a result of a comparative example.

In the working example, each of a SiO$_2$ film, a SiN film, an HfO$_2$ film was deposited as an underlying film in addition to depositing a TiO$_2$ film according to the working example, and then a TiN film was deposited on the deposited underlying film. The film thickness of the TiN film was measured by the number of cycles as a unit. Here, the number of cycles means theoretically depositing one atomic layer by rotating the turntable 2 once, and has the same meaning as the number of rotations of the turntable 2.

In FIG. 7, the horizontal axis shows the number of cycles [cyc], and the vertical axis shows a film thickness [nm] by fluorescent X-ray analysis (XRF). In FIG. 7, a film thickness change of the TiN film to the number of cycles when the underlying film is a TiO$_2$ film is shown by a characteristic line A; a film thickness change of the TiN film to the number of cycles when the underlying is a HfO$_2$ film is shown by characteristic line B; and a film thickness change of the TiN film to the number of cycles when the underlying is a SiO$_2$ film or a SiN film is shown by characteristic line C (since both lines are almost completely overlapped, they are shown by the same symbol C).

As illustrated by FIG. 7, when the TiO$_2$ film was made the underlying film as shown by the characteristic line A, the film thickness increased at the same time as starting the film deposition, and the incubation time could not be found.

In contrast, with respect to the film thickness of the TiN film when the HfO$_2$ film was made the underlying film, because the film thickness increased after the elapse of 20 cycles from the start of film deposition, the incubation time equal to 20 cycles could be found. Similarly, with respect to the film thickness of the TiN film when the SiO$_2$ film or the SiN film was made the underlying film, because the film thickness increased after the elapse of 30 cycles from the start of film deposition, the incubation time equal to 30 cycles could be found. Here, because the incubation time of the characteristic line C is longer than that of the characteristic line B, the TiN film deposited on the underlying film of SiO$_2$ film or the SiN film is likely to have island films more than the TiN film deposited on the underlying film of HfO$_2$ film.

In this manner, when a film other than the TiO$_2$ film is made the underlying film, the incubation time can be found. In such a state, because the film deposition starts from the formation of island films, the TiN film can be deposited as a continuous film that does not contain a pinhole even when a very thin film equal to or less than 8 nm is deposited.

In the above-discussed embodiments and the working examples, for example, an organic source containing titanium may be used as the gas supplied from the first reaction gas nozzle 31 (i.e., titanium-containing gas), and is not limited to TiCl$_4$ gas. Moreover, for example, monomethylhydrazine or the like may be used as the gas supplied from the second reaction gas nozzle (i.e., nitriding gas, nitrogen-containing gas), and is not limited to ammonia gas.

According to the embodiments of the present invention, a continuous film of a TiN film can be deposited without generating delay time in starting the film deposition.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A method of depositing a continuous TiN film on a silicon wafer, the method comprising steps of:
   depositing a continuous TiO$_2$ film having a thickness equal to or thinner than 2 nm on a silicon wafer; and
   depositing a continuous TiN film having a thickness equal to or thinner than 4 nm on the continuous TiO$_2$ film, the TiN film being thicker than the TiO$_2$ film.

2. The method as claimed in claim 1,
   wherein the silicon wafer has an underlying film formed thereon, and
   the step of depositing the continuous TiO$_2$ film on the silicon wafer is performed by depositing the continuous TiO$_2$ on the underlying film on the silicon wafer.

3. The method as claimed in claim 2, wherein the underlying film formed on the silicon wafer is an SiO$_2$ film.

4. The method as claimed in claim 1, wherein the step of depositing the continuous TiO$_2$ film and the step of depositing the continuous TiN film are performed by an ALD method.

5. A method of depositing a continuous TiN film on a substrate, the method comprising steps of:
   placing a substrate on a turntable provided in a process chamber, a first and second process areas being provided above the turntable apart from each other in a rotational direction of the turntable and in the process chamber, a first gas nozzle being provided in the first process area, at least one second gas nozzle being provided in the second process area;
   depositing a continuous TiO$_2$ film on the substrate; and
   depositing a continuous TiN film on the continuous TiO$_2$ film, the TiN film being thicker than the TiO$_2$ film,
   wherein the step of depositing the continuous TiO$_2$ film and the step of depositing the continuous TiN film are performed by an ALD method,
   wherein the step of depositing the continuous TiO$_2$ film is performed by rotating the turntable to cause the substrate to alternately pass through the first and second process areas while supplying a Ti-containing gas from the first gas nozzle and supplying an oxidation gas from the at least one second gas nozzle, and
   wherein the step of depositing the continuous TiN film is performed by rotating the turntable to cause the substrate to alternately pass through the first and second process areas while supplying the Ti-containing gas from the first gas nozzle and supplying a nitriding gas from the at least one second gas nozzle.

6. The method as claimed in claim 5, wherein the Ti-containing gas is TiCl$_4$ gas.

7. The method as claimed in claim 5, wherein the nitriding gas is NH$_3$ gas.

8. The method as claimed in claim 5,
wherein the at least one second gas nozzle includes a plurality of gas nozzles, and
the oxidation gas and the nitriding gas are supplied from different gas nozzles of the plurality of nozzles.

9. The method as claimed in claim 5,
wherein first and second separation areas are provided between the first and second process areas in the rotational direction of the turntable, respectively, and
wherein each of the step of depositing the continuous $TiO_2$ film and the step of depositing the continuous TiN film is performed by rotating the turntable to cause the substrate to pass through the first process area, the first separation area, the second process area and the second separation area in sequence, repeatedly.

* * * * *